(12) United States Patent
Stoll et al.

(10) Patent No.: US 7,038,441 B2
(45) Date of Patent: May 2, 2006

(54) TEST APPARATUS WITH LOADING DEVICE

(75) Inventors: Karsten Stoll, Bautzen (DE); Stefan Kreissig, Venusberg (DE); Alf Wachtveitl, Dresden (DE); Michael Teich, Friedewald (DE); Stefan Schneidewind, Reichenberg (DE); Claus Dietrich, Sacka (DE); Jorg Kiesewetter, Dresdsen (DE); Dietmar Runge, Grosserkmannsdorf (DE)

(73) Assignee: SUSS MicroTec Testsystems GmbH, Sacka bei Dresden (DE)

( * ) Notice: Subject to any disclaimer, the term of this patent is extended or adjusted under 35 U.S.C. 154(b) by 220 days.

(21) Appl. No.: 10/677,524

(22) Filed: Oct. 2, 2003

(65) Prior Publication Data

US 2004/0108847 A1 Jun. 10, 2004

(30) Foreign Application Priority Data

Oct. 2, 2002 (DE) .......................... 102 46 282
Oct. 2, 2002 (DE) .......................... 102 46 232

(51) Int. Cl.
*G01R 31/02* (2006.01)

(52) U.S. Cl. ..................... 324/158.1; 324/760
(58) Field of Classification Search .............. 324/158.1, 324/760, 765; 414/590
See application file for complete search history.

(56) References Cited

U.S. PATENT DOCUMENTS 5,077,523 A * 12/1991 Blanz .......................... 324/760
5,410,259 A * 4/1995 Fujihara et al. ............. 324/758
5,936,416 A * 8/1999 Tanaka et al. ............... 324/754
6,420,864 B1 * 7/2002 Abraham et al. ........ 324/158.1
6,545,458 B1 * 4/2003 Yamazaki ................ 324/158.1
6,762,616 B1 * 7/2004 Kawaguchi et al. ........ 324/765

* cited by examiner

Primary Examiner—Ernest Karlsen
(74) Attorney, Agent, or Firm—Baker Botts LLP

(57) ABSTRACT

The invention, which relates to a test apparatus with loading device which has a chuck, which is provided with a bearing surface for a test substrate and with a chuck drive, by means of which the chuck can be displaced with a working area, and which has a receiving means for receiving test substrates, which can be displaced from a working area of the chuck to a receiving position outside the working area, is based on the object of increasing the accuracy of the movement of the chuck. Moreover, in the case of test apparatus with a controlled atmosphere, a further object is to prevent the chuck from being exposed to the open-air atmosphere. This is achieved by virtue of the fact that a carriage, which can be displaced between a position close to the chuck, in which the chuck is located in a position inside the working area, and the receiving position, is provided, which carriage is provided with a holder, in which the test substrate can be at least indirectly inserted in such a way that the test substrate, when the carriage is in the position close to the chuck, is located above the chuck. The holder and the chuck can move vertically relative to one another when the carriage is in the position close to the chuck.

20 Claims, 10 Drawing Sheets

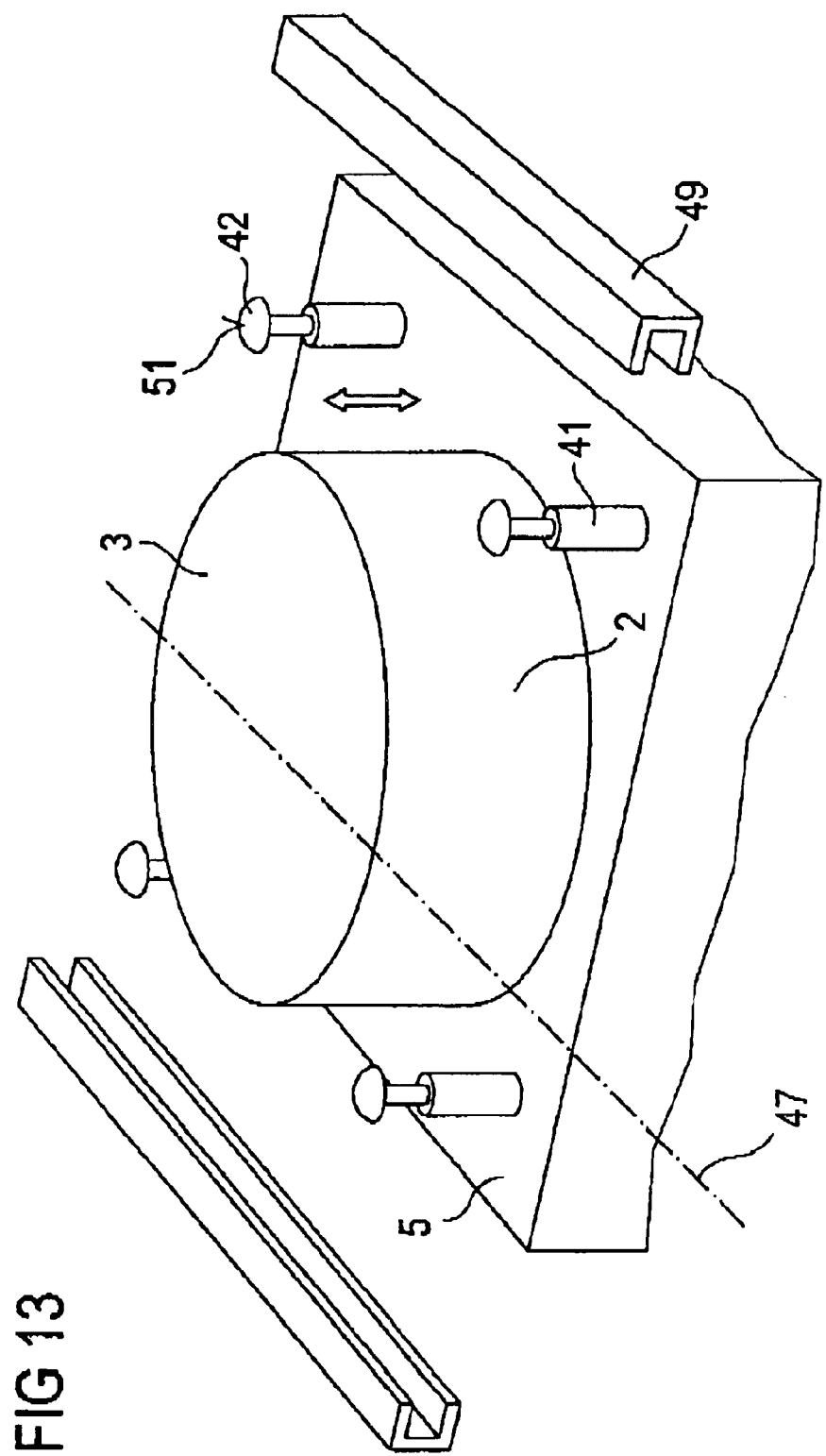

TEST APPARATUS WITH LOADING DEVICE

BACKGROUND OF THE INVENTION

This application is related to the subject matter of commonly owned, co-pending application Ser. No. 10/677,178, filed on even date herewith, the specification of which is incorporated herein by reference.

The invention relates to a test apparatus with loading device, which has a chuck which has a bearing surface for a test substrate, comprising a substrate carrier and component which is to be tested, and is provided with a chuck drive. The chuck can be displaced within a working area by means of the chuck drive. Furthermore, there is a receiving member for receiving test substrates, which can be displaced from a first position within a working area of the chuck to a second receiving position outside the working area.

Test substrates comprise a substrate carrier, on which components which are to be tested are arranged. Components of this type may be semiconductor chips. If these semiconductor chips are tested while they are still on the semiconductor wafer, i.e. while they are still joined to the wafer, the semiconductor wafer itself forms the substrate carrier. However, test substrates may also be other components, such as individual semiconductor chips, hybrid components, micromechanical components and the like. In this case, the test substrates are arranged on the substrate carrier during testing. Each substrate carrier has a smooth and planar underside for resting on the bearing surface of the chuck.

To test test substrates, such as for example semiconductor chips which are still joined to semiconductor wafers, i.e. to test the operational reliability of the semiconductor chips, the latter are brought into contact with contact-making needles, then electrical signals are applied to them via these contact-making needles and the electrical reaction is measured. In this context, it is also possible to test for the optical reaction of the semiconductor chips to the electrical signals or the electrical reaction of the semiconductor chips to the application of light or other radiation. Testing of this type is carried out in a test apparatus, in which the semiconductor wafers are placed onto a wafer receiver, known as a chuck, and are held on the latter. The chuck is located on an X-Y table, so that the semiconductor wafer can be positioned relative to the contact-making needles.

Test apparatus are used to test substrates under different environmental conditions. To produce these environmental conditions, the chuck is surrounded by a housing, inside which it can move freely. This housing allows a controlled atmosphere to be established. The housing can also be used to provide a shield from undesired electromagnetic radiation.

The chuck is used not only to receive the test substrates but also to perform several further functions, such as heating or cooling of the test substrates or the setting of a controlled potential. For this purpose, the chuck is provided with media lines for external connection to corresponding media sources.

Whatever configuration of test apparatus is selected, the chuck has to be provided with a test substrate, i.e. has to be loaded, before testing is carried out. Loading devices are used for this purpose. A loading device is known for use on a test apparatus produced by Cascade Microtec Inc., in which a guide carriage, by means of which the chuck can be detached from the X-Y table and moved out of the housing, is provided on the X-Y table. For this purpose, a flap which allows the chuck to move out is provided in the housing.

For loading purposes, the chuck is moved out of the housing on the guide carriage, through the flap, so that it moves to a receiving position. The receiving position is located on a side of the test apparatus on which an operator usually stands. In this receiving position, a semiconductor wafer is placed onto the chuck by means of forceps. Then, the chuck is moved back in until it has returned to its position above the X-Y table, before then being displaced with the X-Y table for positioning of the contact-making needles. After the chuck has been moved into the housing, the flap is closed again. In this solution, the chuck itself forms the receiving means which is moved from the working area of the chuck into the receiving position. In this case, it should be noted that before the chuck is moved out to the receiving position, it adopts a position within its working area which is closest to the receiving position, in order to keep the displacement distances as short as possible.

A first drawback of this solution is that the chuck has to cover relatively long displacement paths. In this case, all the media lines have to follow this long movement of the chuck and themselves have to be made relatively long. In particular refrigerant lines are relatively rigid and therefore impede the movement of the chuck out of the housing and also the movement of the chuck on the X-Y table. This adversely affects the accuracy of the movement.

A second drawback is that it has to be possible to detach the chuck from the X-Y table, since this entails additional instability and therefore inaccuracies.

A third drawback is that in this solution the chuck has to be moved out of the housing even in situations in which it has to perform cooling functions. In the process, it is then exposed to the open ambient atmosphere, from which moisture will precipitate on the cold chuck, leading to an extremely undesirable introduction of moisture into the housing.

The invention is therefore based on the object of increasing the accuracy of the movement of the chuck. Moreover, in the case of test apparatus with a controlled atmosphere, a further object is to prevent the chuck from being exposed to the open-air atmosphere.

SUMMARY OF THE INVENTION

This object is achieved by virtue of the fact that a carriage, which can be displaced between a first position close to the chuck, in which the chuck is located in a position inside the working area, and the receiving position, is provided. The carriage is provided with a receiving member, in which the test substrate can be at least indirectly inserted in such a way that the test substrate, when the carriage is in the position close to the chuck, is located above the chuck. The holder and the chuck can move vertically relative to one another when the carriage is in the position close to the chuck.

This allows the carriage to move out of its first position close to the chuck to the receiving position, where it is provided with a test substrate. This can be effected in such a manner that the test substrate is placed directly into the receiving member. However, it is also possible for the test substrate to be connected to the receiving member by further member being connected between them.

Therefore, when the receiving member has been at least indirectly provided with a test substrate, the carriage can move back from the receiving position into the position close to the chuck. This causes the test substrate to move to above the receiving surface of the chuck. The relative movement between chuck and receiving member causes the receiving surface to come into contact with the underside of the test substrate, with the result that the test substrate is transferred to the chuck.

The result of this is that movement of the chuck, which leads to the drawbacks of the prior art which have been outlined above, is avoided.

In one configuration of the invention, there is provision for the working area of the chuck to be surrounded by a housing. In this case, the receiving position lies outside the housing. An opening, which can be closed off by a flap, is provided in the housing. This housing is used to create a controlled environment around the chuck, allowing the test substrate to be tested under various conditions, such as very low temperatures or under a vacuum. It is necessary for the controlled environment to be established during testing. This is ensured by virtue of the fact that the flap can be closed again after the test substrate has been moved into the housing. By contrast, a test substrate can be mounted on the holder in the open-air atmosphere, preferably on the operator side of the test apparatus.

In one embodiment, the carriage has a dedicated carriage drive, which is connected to the chuck drive. This allows short displacement paths of the carriage to be achieved, by virtue of the fact that when a test substrate is being discharged or received, the chuck moves into a position which is as close as possible to the receiving position. The carriage can then move from this close position into the receiving position.

In another embodiment, there is provision for the carriage to have a carriage drive which is connected to the housing. This completely decouples the carriage drive from the chuck. For test substrates to be transferred, the chuck then moves into a defined position which represents the position of the carriage which is close to the chuck. The chuck is then held in this position until the transfer has been effected.

To realize the vertical relative movement between holder and chuck, in one embodiment of the invention there is provision for the carriage or the carriage drive to be provided with a dedicated vertical drive, by means of which the carriage can be moved vertically relative to the chuck. On the other hand, the vertical relative movement can also be realized without a dedicated vertical drive for the carriage, by means of a vertical movement of the chuck, since the chuck is always configured such that it can be moved both horizontally and vertically, i.e. it generally has a dedicated vertical drive.

To ensure that access to the surface of the test substrates is not impeded, in one embodiment the carriage is arranged below a plane in which the bearing surface lies.

In an expedient configuration of the invention, to allow simple realization of the carriage there is provision for the latter to comprise at least one telescopic rail arranged laterally adjacent to the chuck. The receiving member can then be introduced into this telescopic rail; in the case of a telescopic rail, the holder is actually suspended therefrom. In this context, it is also expedient to provide, for example, two telescopic rails, between which the receiving member extends, so that a single-sided lever action on a single telescopic rail can be avoided.

In a variant of the indirect receiving of the test substrate in the receiving member, the receiving member is provided with a forceps holder for receiving forceps which hold the test substrate. Furthermore, the chuck has at least three lifting pins, which can move perpendicular to the bearing surface between a first position, in which the tip of each pin at the upper end of each pin lies in or below the bearing surface, and a second position, in which the tip of each pin is located a certain amount above the bearing surface.

Test substrates are usually handled using forceps. These forceps engage beneath the test substrates on the underside by using a vacuum suction surface. A vacuum is then applied to this suction surface. This can be effected, for example, by means of a vacuum pump in the forceps. In this way, any manual contact, which always entails a high risk of fracture or contamination, is avoided. Forceps of this type can then be placed directly into the forceps holder, where they are moved to above the receiving surface of the chuck together with the test substrate. The vertical relative movement between holder and chuck then causes the underside of the test substrate to come into contact with the tips of the lifting pins, which are located in their second, i.e. extended position. This allows the forceps to be detached from the test substrate, e.g. through the application of air to the vacuum suction surface.

The apparatus which release the forceps from the test substrate will expediently be located in the vicinity of the receiving position even when the carriage is retracted, i.e. when it is located in the position close to the chuck, so that they can readily be handled by an operator. This can be achieved, for example, by virtue of the fact that the forceps have an elongated shank, preferably of a length which is greater than the displacement path of the carriage. Suitable operating means, for example, a valve or an actuating switch for a valve or other unlocking means, can then be arranged on this shank.

After the forceps have been detached, they can be removed from the test substrate, since the extended pins set a distance between the bearing surface and the underside of the test substrate. The forceps can then move freely within this space and can be pulled out. This can be effected by means of the carriage, to the forceps holder of which the forceps are still secured. The carriage can therefore move the forceps back to the receiving position, where the operator again detaches the forceps from the holder. The carriage is then moved back into the housing.

After the forceps have been removed beneath the test substrate, the lifting pins are moved into their first position, so that the underside of the test substrate comes into contact with the bearing surface. The chuck has thus been loaded with the test substrate. The above steps are performed in the reverse order for the purpose of removing the test substrate.

Particularly when the carriage is arranged beneath the plane of the bearing surface, it is expedient for the forceps holder to be provided with a vertical support, with the forceps holder at a vertical distance from the carriage. This ensures that the test substrate is held at the height of the bearing surface by the forceps.

In another variant of the way in which the test substrate is received by the receiving member, the chuck comprises a chuck body with a chuck surface and a chuck plate which rests on the chuck surface. The chuck plate is provided with the bearing surface and can be detached from the chuck body. The chuck plate has at least three lugs projecting above the chuck surface. The holder has an opening, which has an opening surface area which is similar to the chuck surface, such that the holder, in the position close to the chuck, at least partially engages around the chuck body without contact and at a distance therefrom which is smaller than the extent to which the lugs project above the chuck surface.

The opening area allows the receiving member to move vertically relative to the chuck while at least partially engaging around the chuck. If a vertical relative movement is then carried out, the receiving member engages beneath the lugs of the chuck plate and lifts them off the chuck surface. The movement of the carriage toward the receiving position can then take place. Then, at this receiving position, a test substrate is placed onto the bearing surface located on the chuck plate. Next, the carriage together with receiving member, chuck plate and test substrate is moved back into the position close to the chuck, where the chuck plate with the test substrate resting on the bearing surface is placed onto the chuck surface, once again through the execution of a vertical relative movement. In this way, the chuck is loaded with the test substrate.

With this solution too, it is not necessary to move the entire chuck, and consequently the drawbacks of the prior art which were outlined in the introduction can be avoided.

One possible configuration of the chuck plate consists in the lugs being joined integrally to the chuck plate.

In another variant, the lugs may form separate components which are fixedly connected to the chuck plate.

In the variant with the chuck plate, the receiving member is expediently designed in such a manner that the receiving member comprises a plate in which the opening surface area is formed.

According to a further configuration of the invention, the chuck once again comprises a chuck body with a chuck surface and a chuck plate which rests on the chuck surface, is provided with the bearing surface and can be detached from the chuck body. In this case, the chuck plate, on its underside, has first holding members, which engage releasably in second holding members, which are connected to the chuck. The carriage can be pushed in from the outside from the receiving position. In this case the carriage has a third holding member, which engages releasably into a fourth holding member on the chuck plate.

In this case, the carriage is mounted outside the test apparatus and is only pushed in for loading purposes. This prevents, for example, moisture from being introduced by the carriage if the latter were, for example, to become cold inside the housing during testing.

In another configuration with a carriage which can be pushed in, the substrate carrier, on its underside, has first holding members which engage releasably in second holding members, which are connected to the chuck. The carriage can be pushed in from the outside from the receiving position and has a third holding member, which engages releasably in a fourth holding member on the substrate carrier.

This has the advantage in particular that the test substrates can be prepared outside the test apparatus. By way of example, a substrate carrier can be mounted with a plurality of components which are to be tested.

Furthermore, in both embodiments of a carriage which can be pushed in from the outside, the first holding members comprises guide grooves, into which a holding pin engages as second holding members, or vice versa. This allows the chuck plate or the substrate carrier to be held on the chuck body or chuck simply as a result of the carriage being pushed in.

It is expedient if the guide groove has a groove edge which reduces the guide groove width to a slot in the edge region of the guide groove, and the holding pin has a mushroom-like head which engages beneath the groove edge of the guide groove, it being possible for the holding pin to move longitudinally in the slot.

A guide groove configuration of this type on the one hand produces lateral holding and also blocks the chuck plate or the substrate carrier toward the top. This makes it possible to make use of a vertical relative movement triggered by the chuck or the chuck body to establish a nonpositive connection between substrate carrier and chuck or between chuck body and chuck plate. For this purpose, only the chuck body or the chuck is moved upward and accordingly presses against the chuck plate or the substrate carrier. Since the latter is held over the groove edge of the guide groove and correspondingly over the top downward, a compressive force is produced. This nonpositive connection in turn increases the thermal contact between the components.

According to a further embodiment of the invention, the chuck plate or the substrate carrier, on its right-hand and left-hand sides, as seen from the receiving position, has longitudinal guides which run parallel to the straight line of motion between the receiving position and the position close to the chuck. The carriage has two inner guide rails, in which the longitudinal guides can be pushed. Outer guide rails, into which the carriage can be pushed in a push-in plane, are provided in a fixed location relative to the receiving position.

This makes it possible for the carriage together with substrate carrier and/or chuck plate to be pushed on the outer guide rails from the receiving position to the position close to the chuck, where the substrate carrier or the chuck plate is held in place by the first and second holding members. Then, the carriage can be pulled out again, with the carriage sliding back in the outer guide rails. In the process, the chuck plate or the substrate carrier is pulled out of the carriage, with its longitudinal guides sliding in the inner guide rails.

In this case, it is particularly expedient if four holding pins with upwardly facing heads and two guide grooves lying parallel to the straight line of movement are provided. In each case two holding pins correspond to each guide groove. The holding pins are connected in a vertically movable manner to the chuck or the chuck body and are pulled under spring load into their lower position. As the guide grooves are pushed onto the holding pins the base surfaces of the guide grooves are supported on the top points of the heads, with the longitudinal guides being released from the inner guide rails.

The result of this is that as the carriage is being pushed in, the substrate carrier or chuck plate is pushed onto the heads and in the process the longitudinal guides are released from the inner guide rails. This makes it easier for the substrate carrier or chuck plate to slide out of the carriage.

The third holding member can be detached from the fourth holding member from the outside. While the substrate carrier or chuck plate is being pulled out, there must necessarily be a connection between the third and fourth holding members in order to allow a suitable tensile force to be exerted. While the carriage is being pushed in, it is expedient likewise to produce a connection between the third and fourth holding members. Then, when the position close to the chuck is reached, the third and fourth holding members can be detached from one another from the outside.

The invention is to be explained in more detail below with reference to an exemplary embodiments.

DESCRIPTION OF THE DRAWINGS

FIG. 8 shows a perspective illustration of a test apparatus according to the invention with a carriage which can be pushed in, FIG. 9 shows a perspective illustration of a carriage which can be pushed in, FIG. 13 shows an outline perspective illustration of a chuck with second holding elements.

DESCRIPTION OF THE INVENTION

Figure 1:
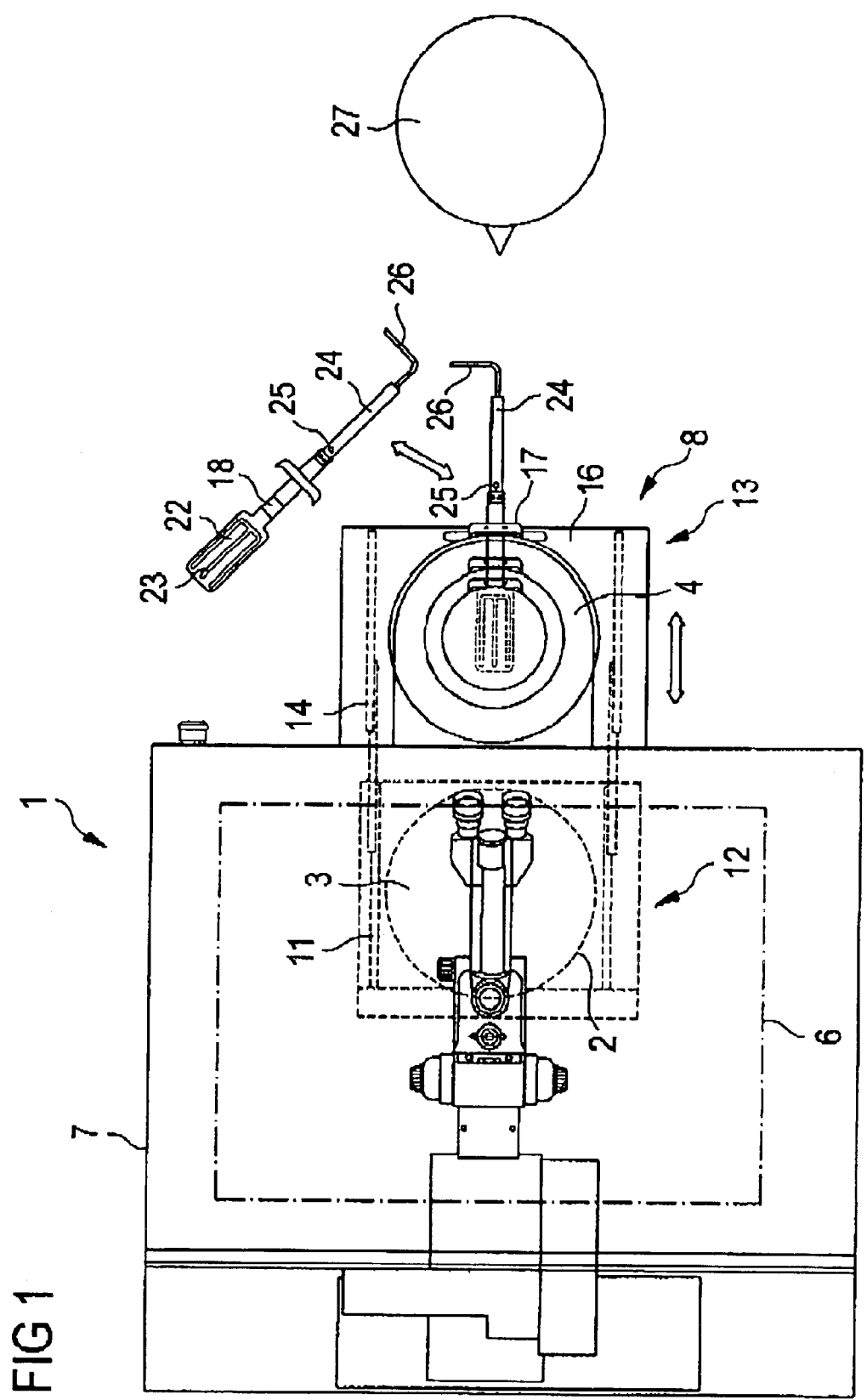
FIG. 1 shows a plan view of a test apparatus with loading device in a first variant having forceps.

As illustrated in FIGS. 1 to 7, a test apparatus 1 has a chuck 2 which is provided with a bearing surface 3 for a semiconductor wafer 4 as test substrate.

The chuck 2 is provided with a chuck drive 5, by means of which the chuck 2 can be displaced in a working area 6. The working area 6 of the chuck 2 is surrounded by a housing 7 which, on its operator side 8, has an opening 9 which can be closed off with a flap 10.

A carriage 11, which can be displaced between a first position 12 close to the chuck, in which the chuck 2 is located in a position inside the working area 6, and the second receiving position 13 through the opening 9 in the housing 7, is arranged at the chuck 2. The carriage 11 comprises two telescopic rails 14 which are arranged laterally adjacent to the chuck 2 and are arranged below a plane in which the bearing surface 3 lies. The carriage 11 also has a carriage drive 15, which is connected to the chuck drive 5.

The carriage 11 is provided with a receiving member 16.

Figure 2:
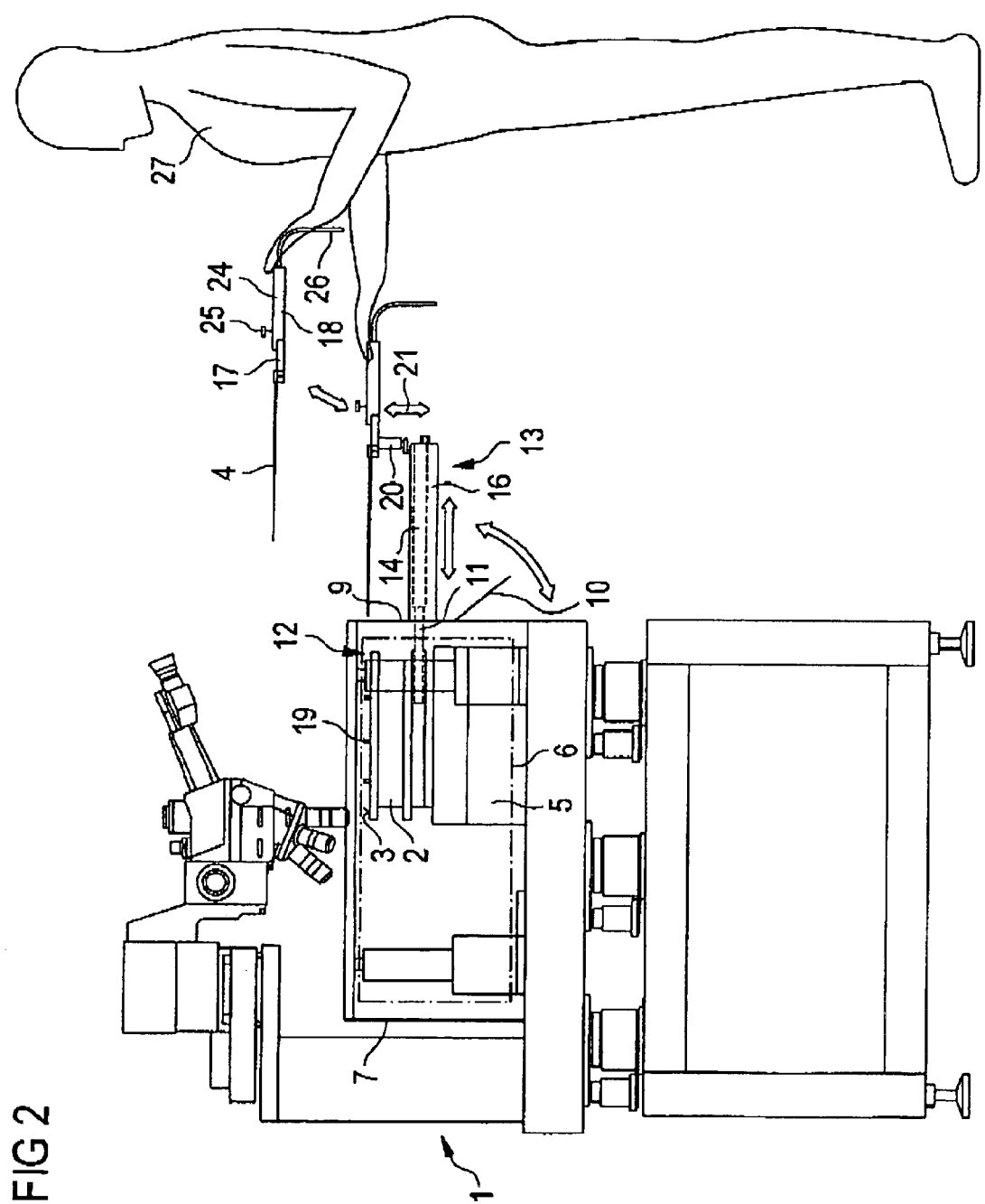
FIG. 2 shows a side view of the test apparatus shown in FIG. 1.

As illustrated in FIGS. 1 and 2, the receiving member 16 is provided with a forceps holder 17 for receiving forceps 18 which hold the semiconductor wafer 4. Three lifting pins 19 are arranged in the chuck 2 and can move perpendicularly with respect to the bearing surface.

The forceps holder 17 is provided with a vertical support 20, with the result that the forceps holder 17 is at a vertical distance 21 from the carriage 11, and therefore the semiconductor wafer 4 lies a short distance above the tips of the lifting pins 19.

The forceps 18 are provided with a vacuum suction surface 22, which engages beneath the underside of the semiconductor wafer 4. Vacuum grooves 23, to which a vacuum can be applied, are formed into the vacuum suction surface 22. For this purpose, a three-way valve 25 is arranged in a shank 24 of the forceps 18. This valve is connected, by means of a vacuum port 26, to a vacuum source, and at the other sides is connected to the vacuum grooves 23 and to the open atmosphere. By switching the valve 25, it is possible for the vacuum suction surface 19 to suck the semiconductor wafer 4 onto it or to apply air to the vacuum suction surface 22.

In addition, the forceps 18 may also be provided with a turntable in order also to align the angular position of the semiconductor wafer 4. The turntable is mounted in an air pocket bearing to which a vacuum can also be applied, so that a clamping action is produced. After the aligning operation has ended, this turntable can be fixed in place using a vacuum.

These forceps 18 are now latched directly into the forceps holder 17, where they are moved to above the bearing surface 3 of the chuck together with the semiconductor wafer 4. The vertical relative movement between holder 16 and chuck 2 is produced by a vertical movement of the holder 16. Vertical lowering of the holder 16 causes the underside of the semiconductor wafer 4 to come into contact with the tips of the lifting pins 19, which are located in a defined position above the chuck surface. In this way, the forceps 18 can be released from the semiconductor wafer 4. This is achieved by the application of air to the vacuum suction surface 22 caused by the operator 27 moving the three-way valve 25 into a position in which the vacuum grooves 23 are connected to the open atmosphere.

To ensure that the operator 27 can carry out this release operation without problems, the length of the shank 24 is such that the three-way valve 25, in the position in which the carriage 111 is located in the first position close to the chuck, is accessible from the outside, i.e. from outside the housing 7.

After the forceps 18 have been detached, they can be removed from the semiconductor wafer 4, since the extended lifting pins 19 set a distance between the bearing surface 3 and the underside of the semiconductor wafer 4. The forceps 18 can then move freely within this space and can be pulled out. This once again is effected by means of the carriage 11, to the holder 16 of which the forceps 18 are still secured via the forceps holder 17. The carriage 11 therefore moves the forceps 18 back to the receiving position 13, where the operator 27 releases the forceps 18 from the forceps holder 17. After the carriage 11 has been moved back into its first position 12 close to the chuck, the flap 10 is closed.

Figure 3:
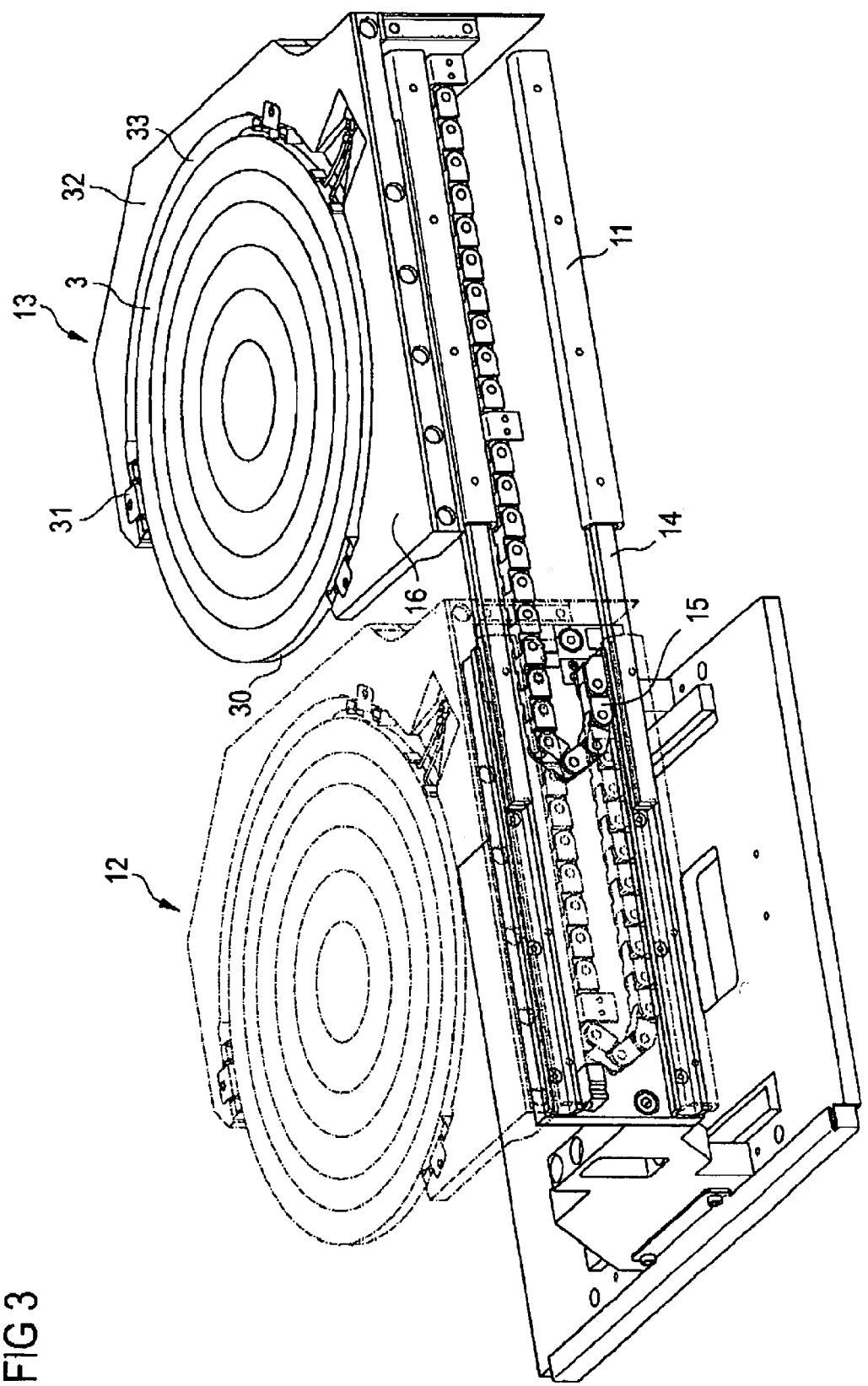
FIG. 3 shows a perspective illustration of a test apparatus with a loading device in a second variant having a chuck plate.
Figure 4:
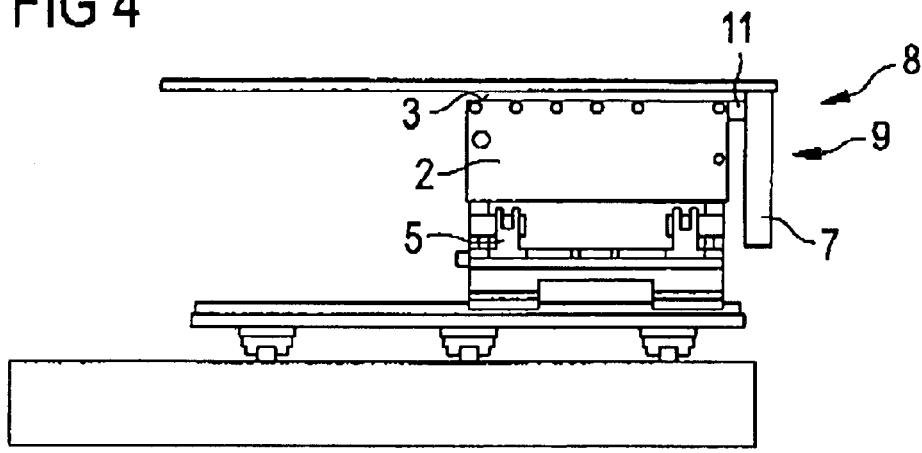
FIG. 4 shows a side view, partially in section, of a test apparatus as shown in FIG. 3, with the chuck plate in the position close to the chuck.
Figure 5:
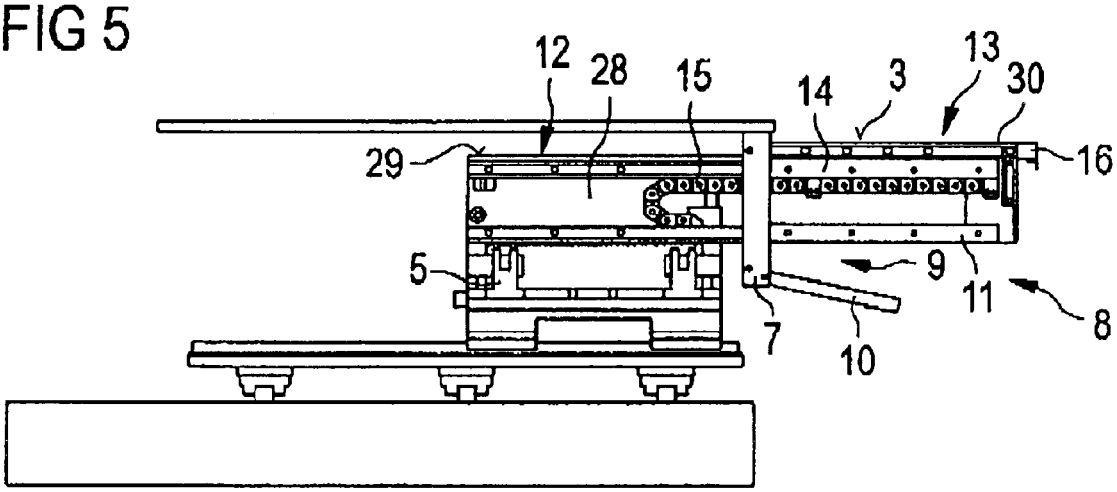
FIG. 5 shows a side view, partially in section, of a test apparatus as shown in FIG. 3, with the chuck plate in the receiving position.
Figure 6:
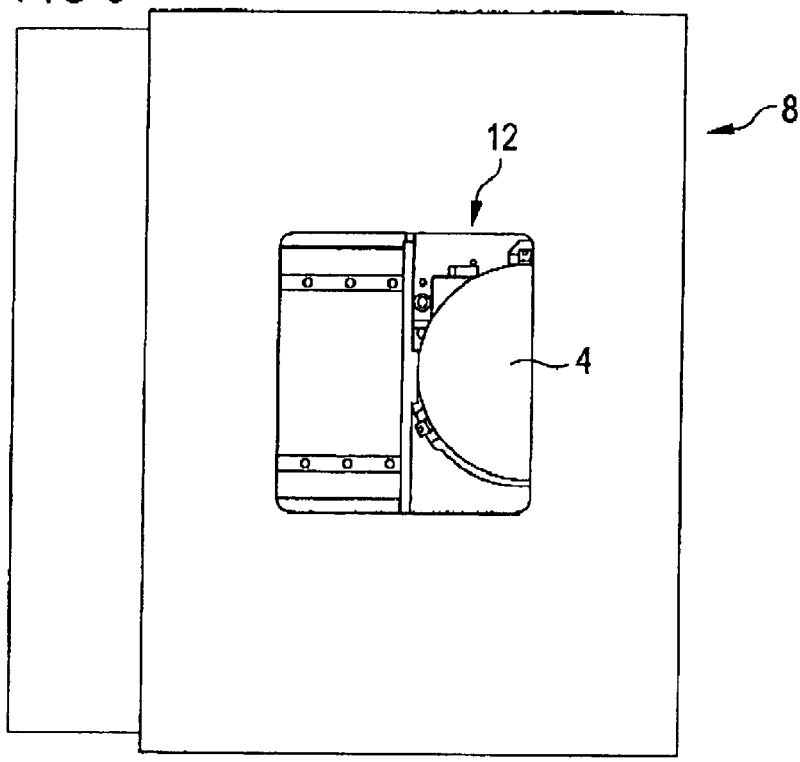
FIG. 6 shows a plan view of a test apparatus as shown in FIG. 3 with the chuck plate in the position close to the chuck.
Figure 7:
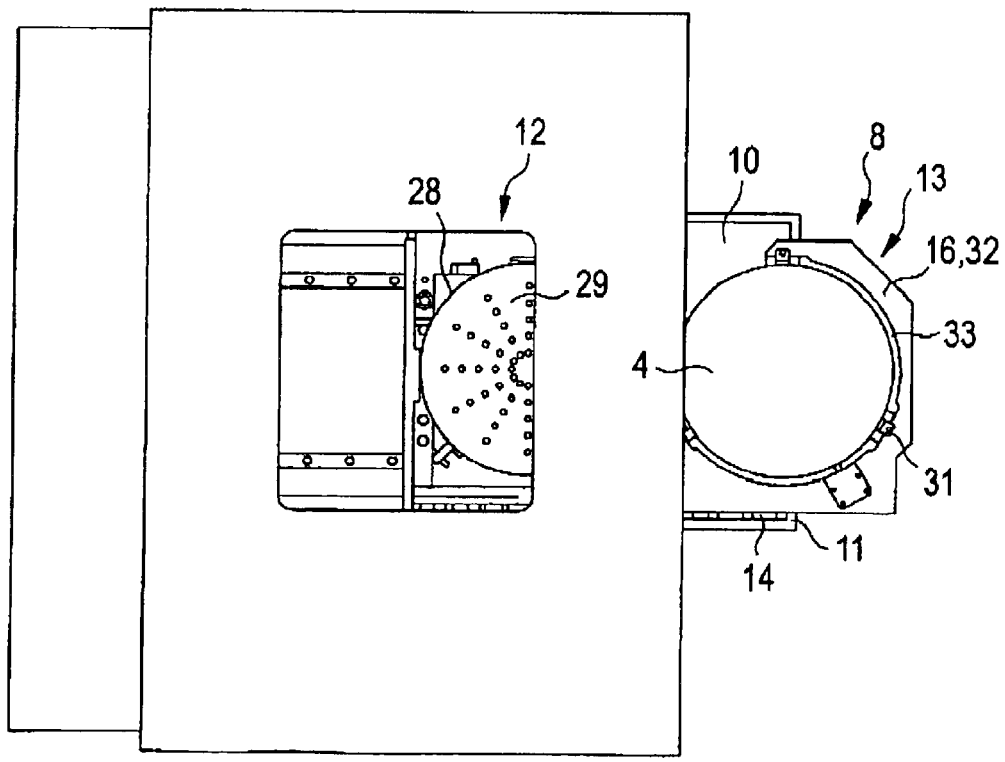
FIG. 7 shows a plan view of a test apparatus as shown in FIG. 3, with the chuck plate in the receiving position.

In the variant illustrated in FIG. 3, the chuck 2 comprises a chuck body 28 with a chuck surface 29 and a chuck plate 30 resting on the chuck surface 29. The chuck plate 30 is provided with the bearing surface 3. It can be detached from the chuck body 28.

The chuck plate 30 has three lugs 31 projecting above the chuck surface 29. The lugs 31 are screwed to the cylindrical chuck plate 30, including an angle of 120° with the angle point at the center of the chuck plate 30.

The receiving member 16 comprises a plate 32 in which an opening 33 with an opening surface area has been formed. The opening surface area of the opening 33 is sufficiently similar to the chuck surface area 29 for the holder 16, in the position close to the chuck, to engage around the chuck body 28 in the region of the chuck surface 29 without contact, at a distance which is smaller than the extent to which the lugs 31 project above the chuck surface 29.

Figure 11:
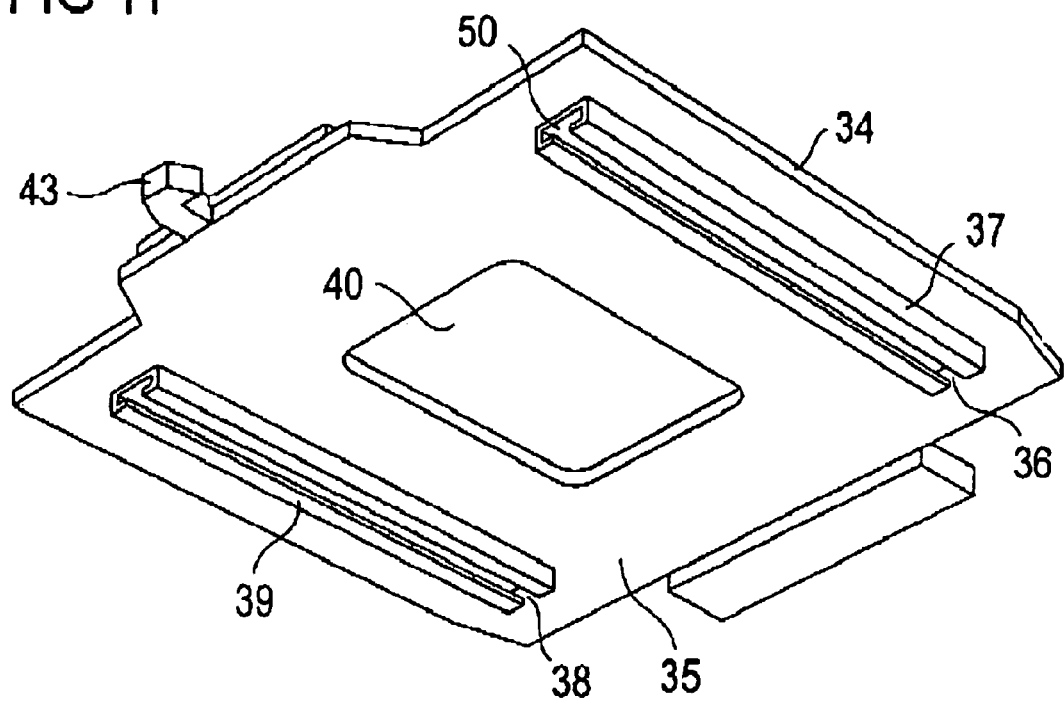
FIG. 11 shows a perspective illustration of the underside of the substrate carrier.

FIGS. 8 to 13 illustrate an exemplary embodiment with a carriage 11 which can be pushed in. In this case, a substrate carrier 34, as illustrated in FIG. 11, has, on its underside 35, the first holding member in the form of a guide groove 36 which has been formed into a guiding profiled section 37. The guiding profiled section 37 is provided with a groove edge 39 which reduces the guide groove width to a slot 38 in the edge region of the guide groove 36. On both sides of a substrate opening 40 which is used to receive components which are to be tested and are not shown in more detail, in each case one guiding profiled section 37 of this type is connected to the underside 35 of the substrate carrier 34.

Two holding members in the form of holding pins 41, which are illustrated in FIG. 13, engage releasably into the guide grooves 36. These holding pins 41 are connected to the chuck 2 in such a way that they can move only in the vertical direction and are subject to downwardly directed spring load. When the chuck 2 is in the lower position, the holding pins 41 are pressed onto the chuck drive 4, while in the upper position they are released from the chuck drive 5.

The reference numerals used here are correspondingly illustrated in one of the other figures.

Figure 8:
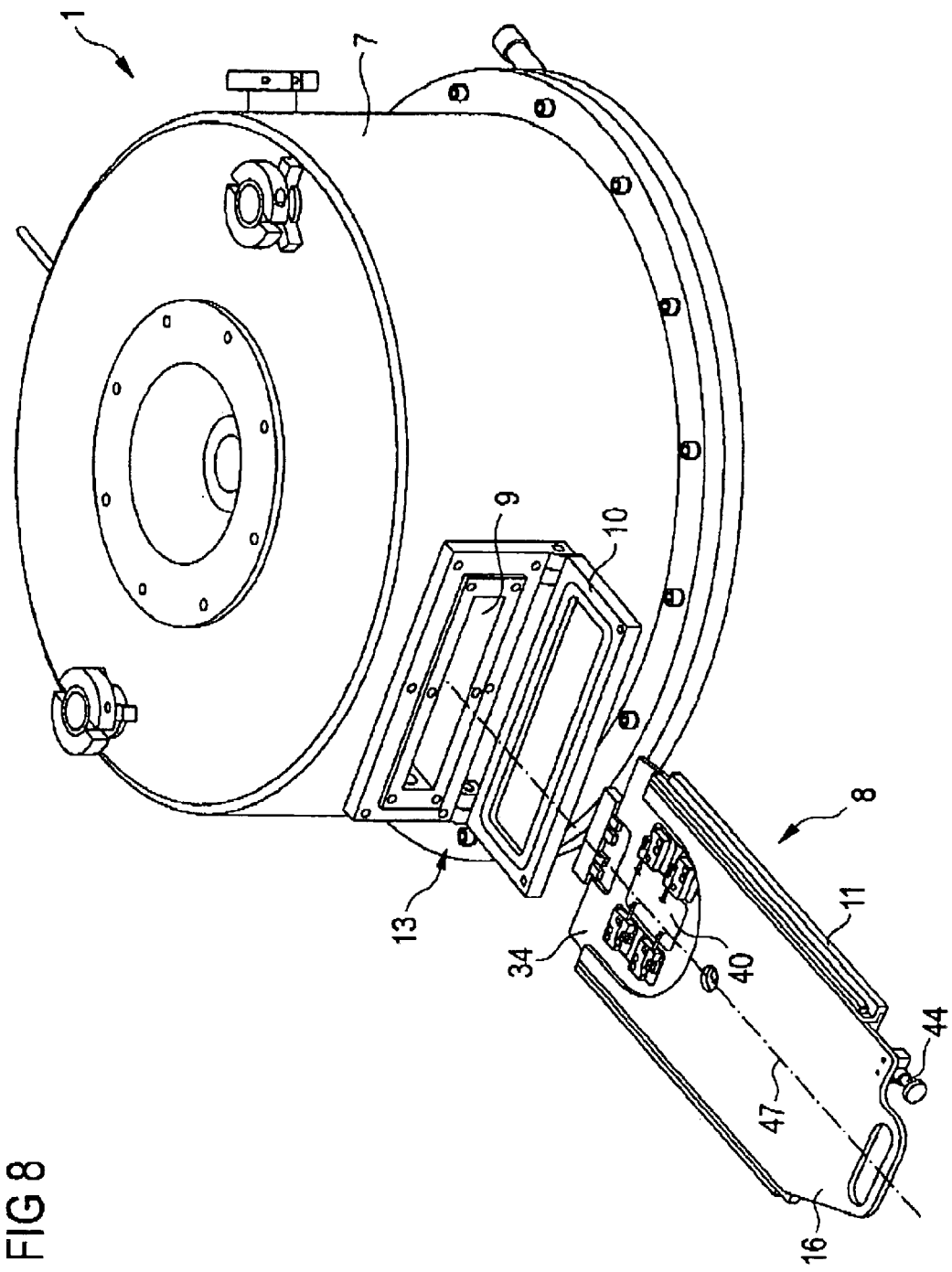
Figure 9:
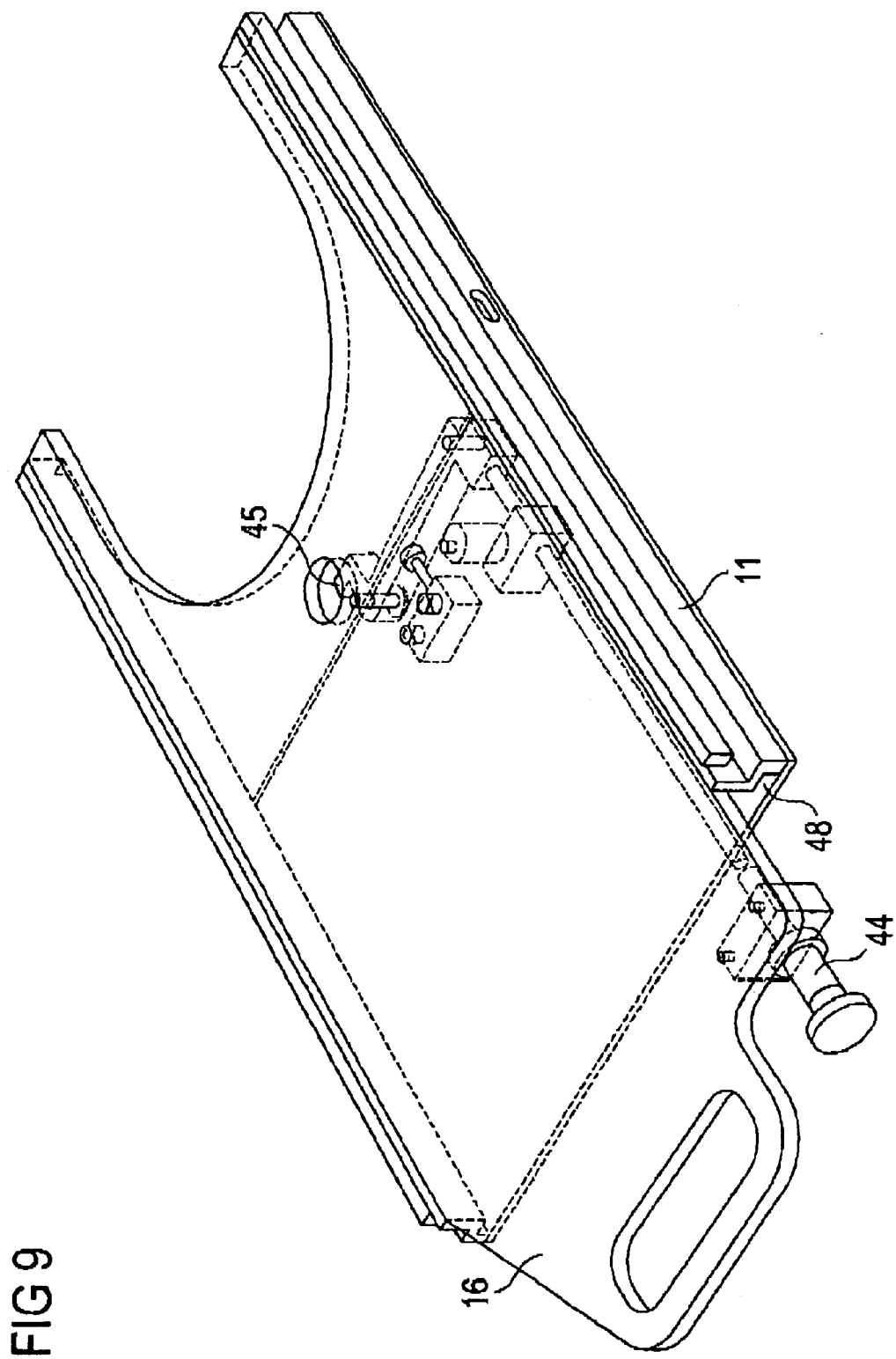
Figure 10:
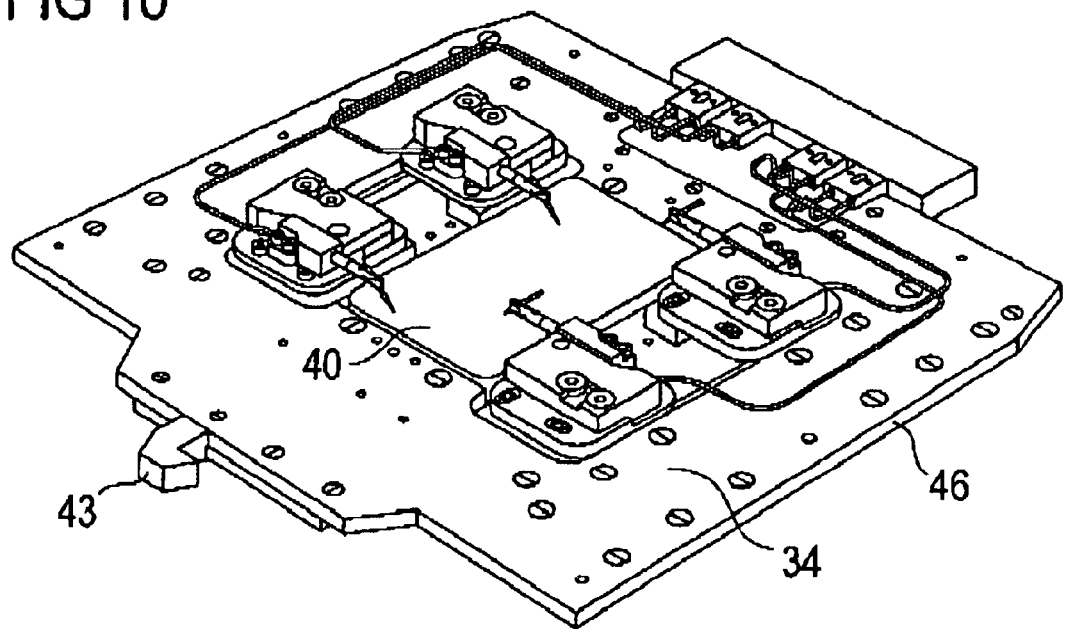
FIG. 10 shows a perspective illustration of a substrate carrier.

As shown in FIG. 8, the carriage 11 can be pushed in from the outside from the receiving position 13.

Figure 12:
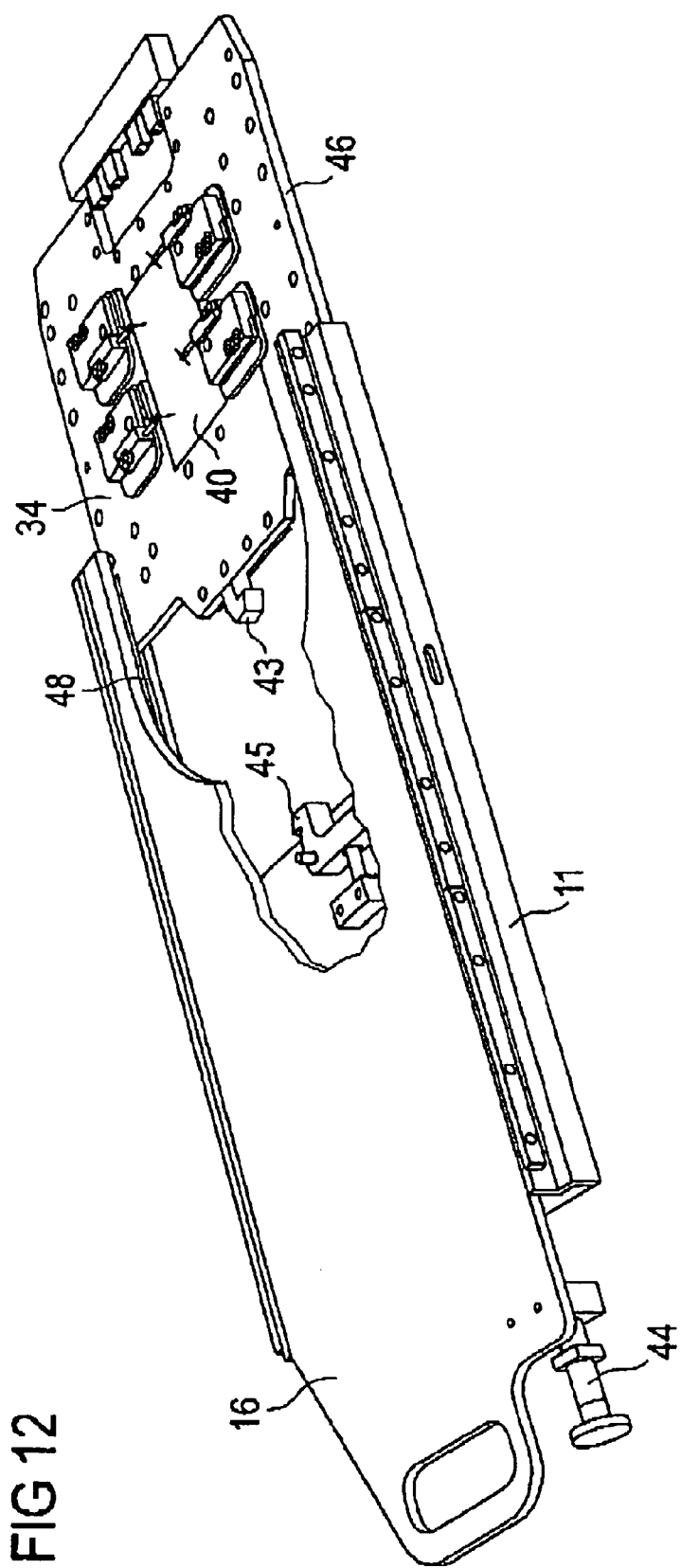
FIG. 12 shows a perspective illustration of a carriage with inserted substrate carrier.

In accordance with the illustration presented in FIG. 12, the substrate carrier 34 has a third holding member in the form of a first pawl 43. A second pawl 45, which is connected to the carriage 11 and can be moved from the outside by the operator 27 via a pull lever 44, engages as a fourth holding member into this first pawl 43. The second pawl 45 can be released from the first pawl 43 by actuation of the pull lever 44.

The substrate carrier 34 is provided, on its right-hand and left-hand sides as seen from the receiving position 13, with longitudinal guides 46, which run parallel to the straight line of movement 47 between second receiving position 13 and first position 12 close to the chuck. For its part, the carriage 11 has two inner guide rails 48, within which the longitudinal guides 46 can be pushed in.

Outer guide rails 49, into which the carriage 11 can be pushed, are provided in a fixed position relative to the second receiving position 13.

The test substrate can be prepared outside the test apparatus 1, by the substrate carrier 34 being mounted, for example, with a plurality of components which are to be tested. The mounted substrate carrier 34 is then pushed, by means of its longitudinal guides 46, into the inner guide rails 48 of the substrate carrier 34. In the process, the second pawl 45 latches into the first pawl 43, preventing the substrate carrier 34 from dropping out of the carriage 11.

Then, the carriage 11, together with the substrate carrier 34, is pushed on the outer guide rails 49 from the receiving position 13 to the position 12 close to the chuck.

When the position 12 close to the chuck is reached, the guiding profile sections 37 slide over the heads 42 of the holding pins 41.

This firstly results in lateral holding. Secondly, the substrate carrier 34 is also blocked toward the top. This then allows a non-positive connection to be produced between the bearing surface 3 of the chuck 2 and the underside 35 of the substrate carrier 34, resulting in good thermally conducting contact. For this purpose, the chuck 2 moves upward when the substrate carrier 34 has been pushed on and accordingly presses against the substrate carrier 34. Since the latter is held at the top by means of the groove edge 39 and correspondingly by means of the head 42 at the bottom, a compressive force is produced.

To assist this operation and to define the compressive force, the holding pins 41 are pulled under spring load into their lower position. As the guide grooves 36 slide onto the holding pins 41, the base surfaces 50 of the guide grooves 36 are supported on the top points 51 of the heads 42, with the guiding longitudinal sides 46 becoming detached from the inner guide rails 48. This makes it easier for the substrate carrier 34 to slide out of the carriage 11. Before this, the second pawl 45 is released from the first pawl 43 by means of the pull lever 44.

Then, the carriage 11 can be pulled completely back out, with the carriage 11 once again sliding in the outer guide rails 49 until it can be removed again at the receiving position 13.

After the components have been tested, the chuck 2 moves back downward, with the result that the substrate carrier 34 is then resting on the holding pins 41 only under its own weight. The carriage 11 is now pushed back through the flap 10. When it reaches the position 12 close to the chuck, the substrate carrier slides into the inner guide rails 48 of the carriage 11. The second pawl 45 then latched into the first pawl 43. The carriage 11 which has been provided with the substrate carrier 34 can then be moved back out of the housing and the test apparatus 1 is ready for the next testing operation.

While there have been described what are believed to be the preferred embodiments of the invention, those skilled in the art will recognize that other and further changes and modifications may be made thereto without departing from the spirit of the invention, and it is intended to claim all such changes and modifications as fall within the true scope of the invention.

What is claimed is:

1. A test apparatus with loading device, comprising:
   a chuck which is provided with a chuck drive, by means of which the chuck can be displaced within a working area;
   a carriage arranged to be displaced between a first position inside the working area close to the chuck and a second receiving position outside the working area; and
   a receiving member mounted on said carriage for receiving test substrates;
   wherein said receiving member and said chuck are arranged for vertical movement with respect to each other when said carriage is in said first position;
   wherein the receiving member is provided with a forceps holder for receiving forceps which hold the test substrate, and the chuck is provided with at least three lifting pins, which can move perpendicular to a bearing surface between and first position, in which the upper tip of each lifting pin lies in or below the bearing surface, and a second position, in which the tip of each pin is located a selected distance above the bearing surface.

2. The test apparatus as claimed in claim 1, wherein said working area of said chuck is surrounded by a housing, wherein said second receiving position is located outside said housing, and wherein an opening, which can be closed off by a flap, is provided in the housing.

3. The test apparatus as claimed in claim 2, wherein the carriage has a carriage drive which is connected to the housing.

4. The test apparatus as claimed in claim 1, wherein the carriage has a carriage drive, which is connected to the chuck drive.

5. The test apparatus with loading device as claimed in claim 1 wherein there is provided a vertical drive for moving the carriage vertically with respect to the chuck.

6. The test apparatus as claimed in claim 1 wherein the carriage is arranged below a bearing surface for a test substrate.

7. The test apparatus as claimed in one of claim 1 wherein said carriage comprises at least one telescopic rail arranged laterally adjacent to the chuck.

8. The test apparatus with loading device as claimed in claims 1, wherein the forceps holder is provided with a vertical support, the forceps holder being at a selected vertical distance from the carriage.

9. A test apparatus with loading device, comprising:
a chuck which is provided with a chuck drive, by means of which the chuck can be displaced within a working area;
a carriage arranged to be displaced between a first position inside the working area close to the chuck and a second receiving position outside the working area; and
a receiving member mounted on said carriage for receiving test substrates;
wherein said receiving member and said chuck are arranged for vertical movement with respect to each other when said carriage is in said first position;
wherein said chuck comprises a chuck body with a chuck surface and wherein the receiving member comprises a chuck plate which rests on the chuck surface and is provided with a bearing surface and wherein the chuck plate is arranged to be detached from the chuck body, wherein the chuck plate has at least three lugs projecting above the chuck surface, and wherein the receiving member has an opening with an opening surface area which is similar to the chuck surface, such that the receiving member, in the first position at least partially surrounds the chuck body without contact and at a spacing therefrom which is smaller than the extent by which the lugs project above the chuck surface.

10. The test apparatus as claimed in claim 9, wherein the lugs are integrally connected to the chuck plate.

11. The test apparatus as claimed in claim 9, wherein the lugs are fixedly connected to the chuck plate.

12. The test apparatus as claimed in one of claims 9 wherein the receiving member comprises a plate in which the opening is formed.

13. A test apparatus with loading device, comprising:
a chuck which is provided with a chuck drive, by means of which the chuck can be displaced within a working area;
a carriage arranged to be displaced between a first position inside the working area close to the chuck and a second receiving position outside the working area; and
a receiving member mounted on said carriage for receiving test substrates;
wherein said receiving member and said chuck are arranged for vertical movement with respect to each other when said carriage is in said first position;
wherein the chuck comprises a chuck body with a chuck surface and a chuck plate which rests on the chuck surface is provided with a bearing surface and can be detached from the chuck body, wherein the chuck plate, on its underside, has first holding members, which engage releasably in second holding members, which are connected to the chuck, wherein the carriage can be pushed in from the outside from the first receiving position, and wherein the carriage has a third holding member, which engages releasably into a fourth holding member on the chuck plate.

14. The test apparatus with loading device as claimed in claims 13 wherein the chuck plate has, on its right-hand and left-hand sides, as seen from the second receiving position, longitudinal guides which run parallel to the direction of motion between the first position and the second receiving position, wherein the carriage has two inner guide rails, within which the longitudinal guides can be pushed in, and wherein outer guide rails into which the carriage can be pushed are provided in a fixed location relative to the second receiving position.

15. A test apparatus with loading device, comprising:
a chuck which is provided with a chuck drive, by means of which the chuck can be displaced within a working area;
a carriage arranged to be displaced between a first position inside the working area close to the chuck and a second receiving position outside the working area; and
a receiving member mounted on said carriage for receiving test substrates;
wherein said receiving member and said chuck are arranged for vertical movement with respect to each other when said carriage is in said first position;
wherein the receiving member comprises a substrate carrier having a first holding members on a lower side thereof which engage releasably in second holding members connected to the chuck, wherein the carriage can be pushed in from the first receiving position, and wherein the carriage has a third holding member which engages releasably in a fourth holding member on the substrate carrier.

16. The test apparatus as claimed in claim 15 wherein the first holding member comprises a guide groove into which the second holding member comprising a holding pin engages.

17. The test apparatus as claimed in claim 16, wherein the guide groove has a groove edge which reduces the guide groove width to a slot in the edge region of the guide groove, and the holding pin has a mushroom-like head which engages beneath the groove edge of the guide groove, it being possible for the holding pin to move longitudinally in the slot.

18. The test apparatus with loading device as claimed in claim 16 wherein the substrate carrier has, on its right-hand and left-hand sides, as seen from the second receiving position, longitudinal guides which run parallel to the direction of motion between first position and the second receiving position, wherein the carriage has two inner guide rails, within which the longitudinal guides can be pushed in, and wherein outer guide rails into which the carriage can be pushed are provided in a fixed location relative to the second receiving position.

19. The test apparatus as claimed in claims 18, wherein four holding pins with upwardly facing heads and two guide grooves lying parallel to the straight lines of movement are provided, in each case two holding pins corresponding to each guide groove, wherein the holding pins are connected in a vertically movable manner to the chuck or the chuck body and are pulled under spring load into their lower position, wherein as the guide grooves slide onto the holding pins the base surfaces of the guide grooves are supported on top points of the heads, with the guiding longitudinal sides being released from the inner guide rails.

20. The test apparatus as claimed in claim 15, wherein the fourth holding means is arranged to be detached from the third holding means from the outside.

* * * * *